(12) United States Patent
Parviainen et al.

(10) Patent No.: US 7,159,167 B2
(45) Date of Patent: Jan. 2, 2007

(54) METHOD AND ARRANGEMENT FOR ENHANCING SEARCH THROUGH TRELLIS

(75) Inventors: Jari Parviainen, Plano, TX (US); Teemu Sipila, Oulunsalo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/516,120

(22) PCT Filed: May 26, 2003

(86) PCT No.: PCT/FI03/00404

§ 371 (c)(1),
(2), (4) Date: Nov. 29, 2004

(87) PCT Pub. No.: WO03/103153

PCT Pub. Date: Dec. 11, 2003

(65) Prior Publication Data

US 2005/0177782 A1    Aug. 11, 2005

(30) Foreign Application Priority Data

May 31, 2002   (FI) ................................. 20021046

(51) Int. Cl.
*H03M 13/03*   (2006.01)
(52) U.S. Cl. .................. 714/792; 714/796; 375/265; 375/341
(58) Field of Classification Search ............. 714/792, 714/796; 375/265, 341
See application file for complete search history.

(56) References Cited

U.S. PATENT DOCUMENTS

| 5,509,020 | A | * | 4/1996 | Iwakiri et al. ............... 714/704 |
| 5,901,182 | A |   | 5/1999 | Kot ............................. 375/341 |
| 5,905,742 | A |   | 5/1999 | Chennakeshu et al. ..... 714/792 |
| 6,446,236 | B1 | * | 9/2002 | McEwen et al. ............ 714/795 |
| 6,490,327 | B1 |   | 12/2002 | Shah ........................... 375/341 |
| 6,788,750 | B1 | * | 9/2004 | Reuven et al. .............. 375/341 |

FOREIGN PATENT DOCUMENTS

| EP | 1 058 394 A1 | 12/2000 |
| WO | WO 00/48370 | 8/2000 |

(Continued)

OTHER PUBLICATIONS

Lin et al., "A Generalized Viterbi Algorithm for Detection of Partial Response Recording Systems," IEEE Transactions on Magnetics, vol. 32, No. 5, Sep. 1996, pp. 3983-3995.

(Continued)

*Primary Examiner*—Albert Decady
*Assistant Examiner*—Esaw Abraham
(74) *Attorney, Agent, or Firm*—Hollingsworth & Funk, LLC

(57) ABSTRACT

The invention relates to a method and arrangement for enhancing a search through a trellis in a detector (220) that is arranged at each stage of the trellis to select a certain set of state indexes of the stage for continuation. The detector (220) is arranged, when each stage of the trellis is calculated, to define more than one unequal threshold value for the values of the state indexes, each threshold value defining one state index group, to calculate for each state index a path metric, to arrange the calculated state indexes into different groups by comparing the path metric value of the state index with the threshold values. Further the detector selects from the groups a certain number of state indexes for continuation in such a manner that starting from the group comprising the highest state indexes, entire groups are selected for continuation until the next entire group does not fit in. From this group only randomly selected state indexes are selected until a given number is collected.

16 Claims, 4 Drawing Sheets

FOREIGN PATENT DOCUMENTS

WO    WO 01/43293 A1    6/2001

OTHER PUBLICATIONS

Figure 1:
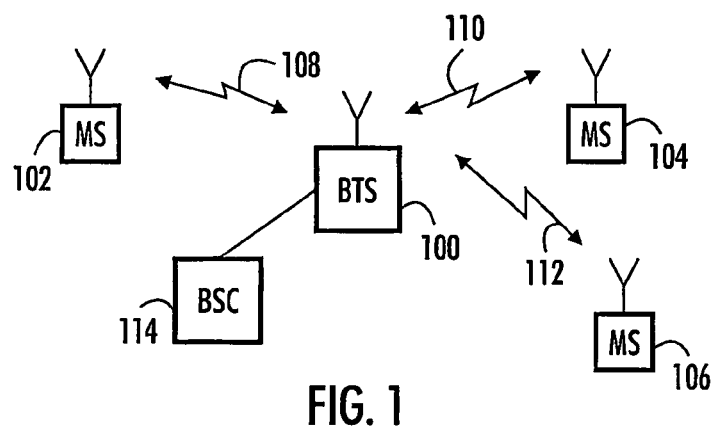

Sedat Olcer, "Reduced-State Sequence Detection of Multilevel Partial-Response Signals," IEEE Transactions on Communications, vol. 40, No. 1, Jan. 1992, pp. 3-6.

Stanley J. Simmons, "A Nonsorting VLSI Structure for Implementing the (M, L) Algorithm," IEEE Journal on Selected Areas in Communications, vol. 6, No. 3, Apr. 1988, pp. 538-546.

Schlegel, "Trellis Coding. Decoding Strategies," IEEE Press, ISBN: 0-7803-1052-7, pp. 153-189.

* cited by examiner

METHOD AND ARRANGEMENT FOR ENHANCING SEARCH THROUGH TRELLIS

FIELD OF THE INVENTION

The invention relates to a method and arrangement for enhancing a search through a trellis, in which at each stage of the trellis a certain set of state indexes of the stage are selected for continuation.

BACKGROUND

The channel used in telecommunications systems often causes interference to data transmission Interference occurs in all kinds of systems, but especially in wireless telecommunications systems, the transmission path attenuates and distorts in many different ways the signal being transmitted. The multipath propagation of the signal, different fades and reflections, and other signals being transmitted on the same transmission path typically cause interference on the transmission path.

To reduce the impact of the interference, several coding methods have been developed to protect signals from interference and to endeavour to eliminate errors caused by interference in signals. Convolutional coding is a much-used coding method. In convolutional coding, the signal to be transmitted that is made up of symbols is coded into code words that are based on the convolution of the symbols to be transmitted either with themselves or with another signal. The coding ratio and generator polynomials define the convolutional code. The coding ratio (kin) refers to the number (n) of the produced coded symbols in relation to the number (k) of the symbols to be coded. The coder is often a shift register. The constraint length (K) of a code often refers to the length of the shift register. The coder can be considered a state machine having $2^{K-1}$ states.

A receiver decodes the coded signal that propagated through the channel. A convolutional code is usually decoded using a trellis whose nodes describe the states of the encoder used in coding the signal, and the paths between the nodes belonging to different stages of the trellis describe the allowed state transitions. A decoder tries to find out the consecutive states of the coder, i.e. the transitions from one state to another. To find out the transitions, the decoder calculates metrics, of which there are two types: path metrics (or state metrics) and branch metrics. Path metrics represent the probability of the set of symbols in the received signal leading to the state described by the node in question. Branch metrics represent the probabilities of different transitions.

A convolutional code is usually decoded by means of the Viterbi algorithm. The Viterbi algorithm is a computationally demanding task. A general problem with the Viterbi algorithm is that when the constraint length is long (e.g. 9, as in WCDMA of the UMTS system), the Viterbi algorithm must search through $2^{(9-1)}$, i.e. 256, states to decode one bit. Efficient signal processing algorithms are still being searched for wireless telecommunications systems in particular, in which the aim is to minimize the size and power consumption of subscriber terminals. A computationally efficient algorithm for speech or data decoding is the M algorithm that is a search algorithm simplified from the Viterbi algorithm. Using the M algorithm makes it possible to reduce the number of searched states, because only M best paths are selected for continuation in the trellis stages instead of all paths. When a suitable value is selected for M, the performance of the decoder does not, however, become significantly poorer. For instance, in the above-mentioned system, M can obtain the value 128, i.e. half of the possible paths are selected for continuation at each stage.

One problem with the use of the M algorithm is the selection of paths for continuation amongst all paths. Typically, the sorting of n elements requires $n^2/2$ comparison operations, and this is a computationally demanding task. Let us assume that the decoding of one bit by DSP (digital signal processing) in WCDMA requires approximately 500 clock cycles when a full search algorithm is used. If the M algorithm is used, the number of states to be searched is smaller but correspondingly, sorting increases the complexity. When sorting 16 elements, 128 comparison operations are required. Thus using the M algorithm with the best 16 paths leads to almost the same complexity as a full search algorithm. If a 256-state code is used, a full sort requires $n^2/2$, i.e. 32768 comparisons. A full search is too complex an operation to implement by the traditional methods.

One known solution for implementing the M algorithm is disclosed in publication S. J. Simmons: *A Nonsorting VLSI structure for implementing the (M,L) algorithm*, IEEE Journal on Selected Areas in Communications, Vol. 6, No. 3, April 1988, pages 538 to 546. The disclosed solution does not perform the actual sorting, but examines several different path metrics at the same time, starting from the most significant bit. While the different paths are examined, decisions are made on keeping or rejecting the routes. If the examined route is opposite to an already selected route, it is rejected. However, the solution disclosed in the publication works poorly in situations where the trellis is large, as in WCDMA of the UMTS system, for instance.

The trellis structure is used not only in the decoding of convolutional codes, but also in several other applications, such as channel equalization. The same above-mentioned problems also apply to these solutions, when the size of the trellis increases.

Thus, to minimize the size and power consumption of devices, more efficient methods than before are needed for searching through a trellis, methods that are fast and whose implementation as ASIC structures does not require much space.

BRIEF DESCRIPTION OF THE INVENTION

It is an object of the invention to provide a method and an apparatus implementing the method in such a manner that a restricted trellis search is possible to perform more advantageously than before. This is achieved by a method for enhancing a search through a trellis, in which at each stage of the trellis a certain set of state indexes of the stage are selected for continuation. The method of the invention comprises defining, at each stage of the trellis, more than one unequal threshold value for the values of the state indexes, each threshold value defining one state index group, calculating for each state index a path metric, arranging the calculated state indexes into different state index groups by comparing the path metric value of the state index with the threshold values, selecting state indexes for continuation from the groups in such a manner that starting from the group comprising the highest state indexes, state indexes are selected from the group in a random order until all indexes of the group have been selected, then continuing to select the state indexes from the next group, and repeating this until a certain number of state indexes have been selected.

The invention also relates to an arrangement for enhancing a search through a trellis in a detector that is arranged at each stage of the trellis to select a certain set of state indexes of the stage for continuation. In the arrangement, the detector is arranged when each stage of the trellis is calculated to define more than one unequal threshold value for the values of the state indexes, each threshold value defining one state index group, to calculate for each state index a path metric, to arrange the calculated state indexes into different groups by comparing the path metric value of the state index with the threshold values, to select from the groups a certain number of state indexes for continuation in such a manner that starting from the group comprising the highest state indexes, entire groups are selected for continuation until the next entire group does not fit in, and from this group only randomly selected state indexes are selected until a given number is collected.

Preferred embodiments of the invention are described in the dependent claims.

The method and arrangement of the invention thus provide several advantages. Implementing preferred solutions of the invention in a receiver is simple. The M algorithm has not been utilized much in practice because of the calculations it requires. By means of the present solution, the M algorithm can be efficiently utilized. Because the solution examines fewer states than the Viterbi algorithm, less memory is required for calculating the paths. This results in savings in equipment costs. Further, the power consumption of the receiver decreases when using the solution, because there is less calculation and less memory space is needed. However, the solution provides a sufficient performance that in practice is equal to that of the earlier methods.

One implementation alternative uses modulo arithmetic to implement the calculation required by the invention. For this reason, no scaling is necessary for the calculated metrics. This simplifies the calculation and the implementation of the solution.

Especially in connection with high data rates, the present solution provides a significant benefit, because in such cases, the size of the trellis is typically large. Large trellises also need to be used for instance when several antennas, complex modulation methods and strong codes are used in transmission and reception. Decoding large trellises increases the amount of required calculation, and in such a situation, the present solution helps curb the amount of calculation.

The solutions of the preferred embodiments can be utilized in all applications that use a trellis. In addition to the above-mentioned decoding of convolutional coding, such applications include the decoding of other types of codes, equalization, multiuser decoding and speech recognition.

LIST OF FIGURES

Figure 2:
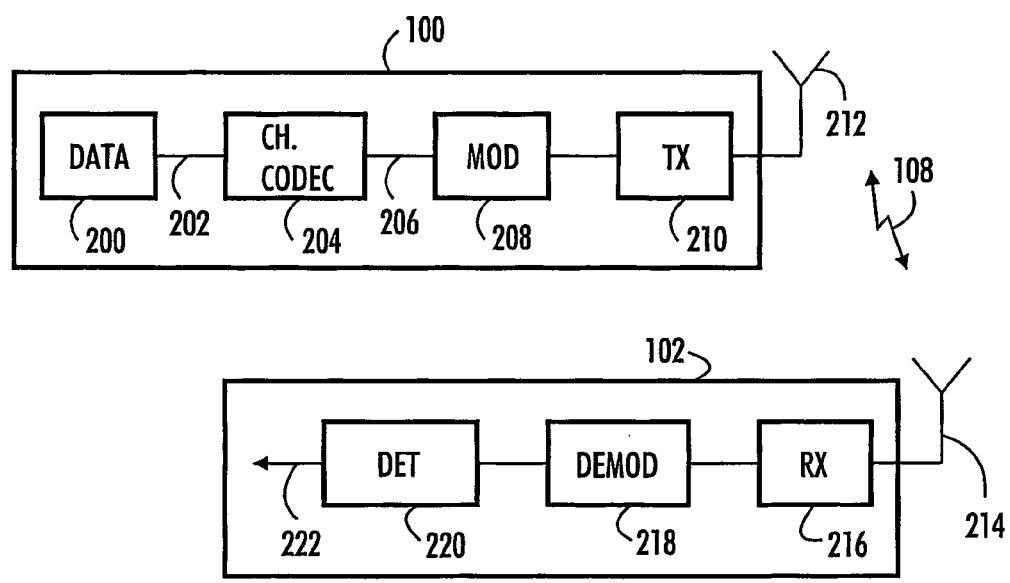
Figure 3:
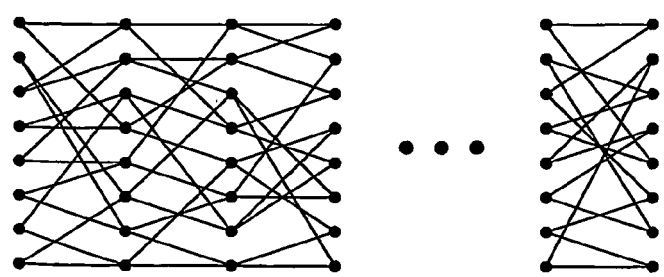
Figure 4A:
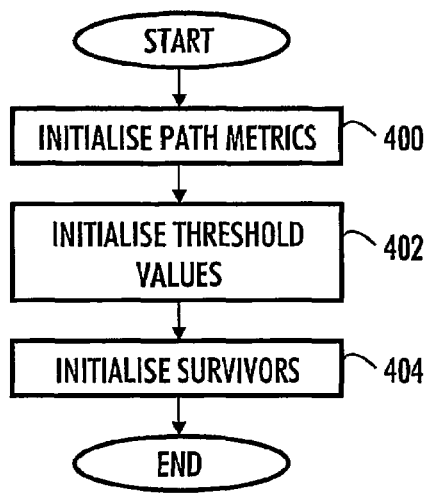
Figure 4B:
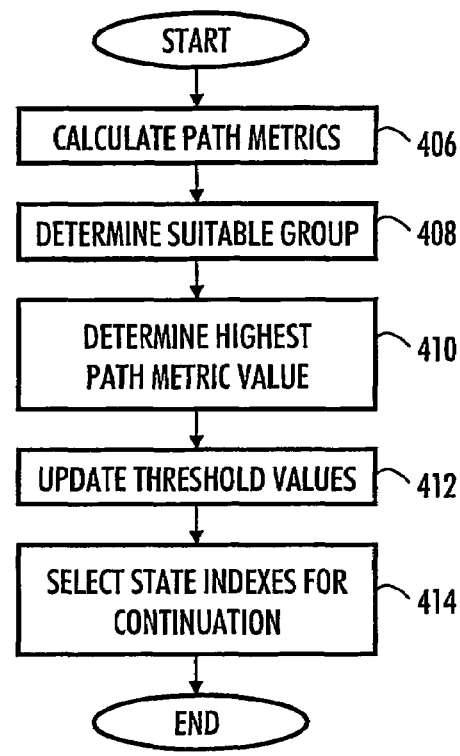
Figure 5A:
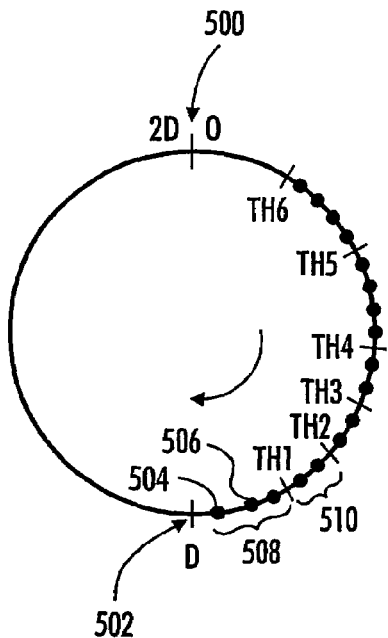
Figure 5B:
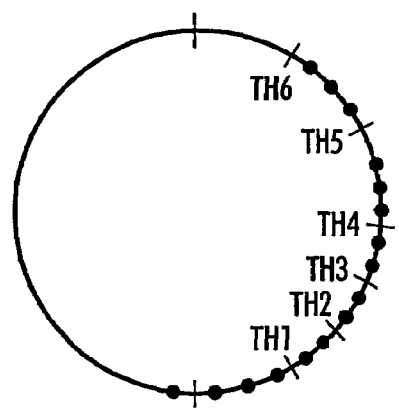
Figure 6:
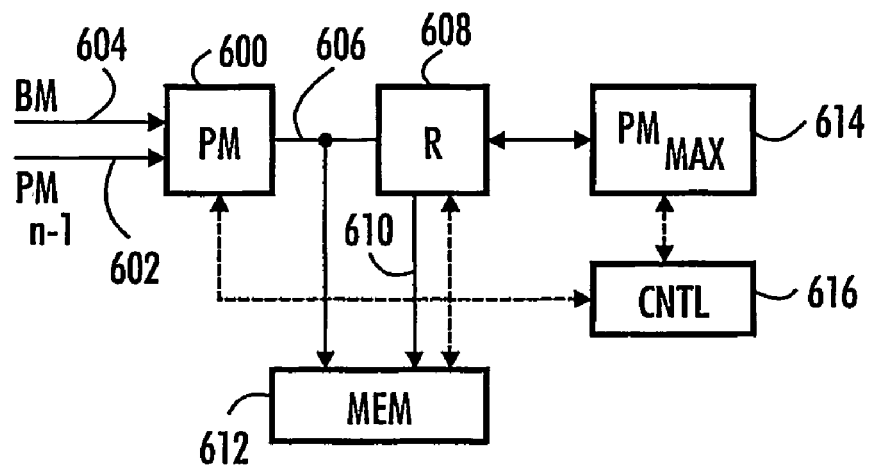
Figure 6:
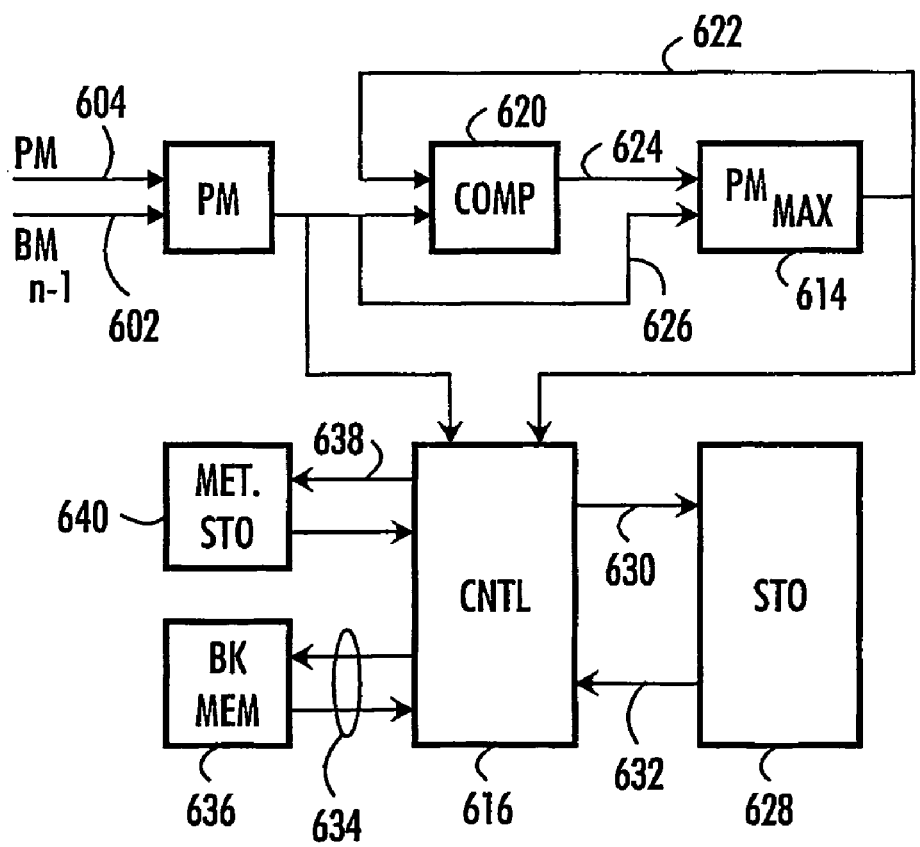
Figure 7:
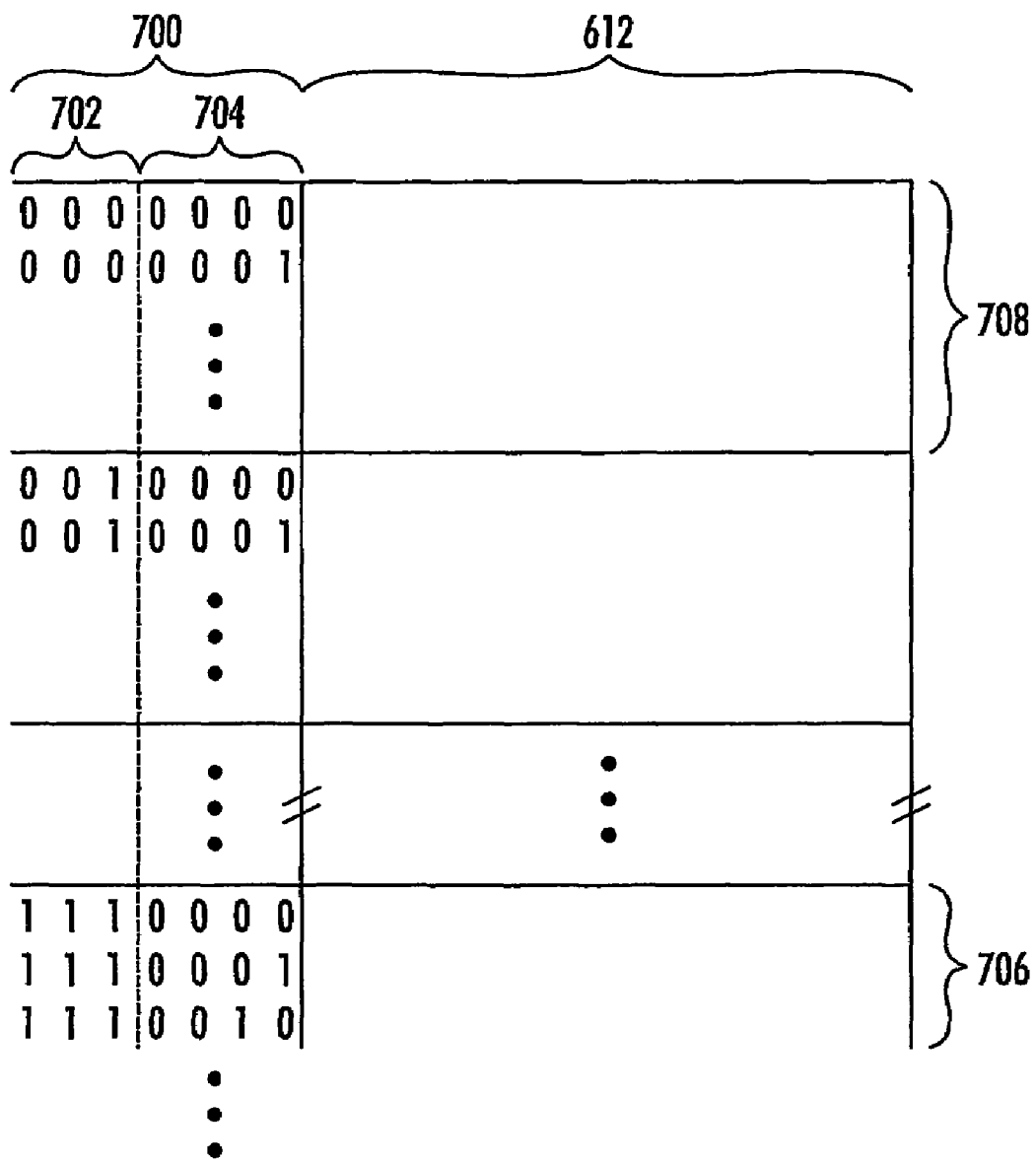

The invention will now be described in more detail by means of the preferred embodiments, with reference to the attached drawings, in which FIG. 1 shows an example of a telecommunications system, to which the preferred embodiments can be applied, FIG. 2 shows an example of a transmitter and receiver, FIG. 3 illustrates a trellis, FIGS. 4A and 4B are flow charts illustrating an example of a preferred method, FIGS. 5A and 5B illustrate calculation using modulo arithmetic, FIGS. 6A and 6B show examples of an arrangement, and FIG. 7 shows an example of a preferred implementation of a memory.

DESCRIPTION OF THE PREFERRED EMBODIMENTS

FIG. 1 shows the parts of the structure of the cellular system that are essential for the invention. The system comprises a base station 100 and a set of generally mobile subscriber terminals 102 to 106 that have a bi-directional connection 108 to 112 to the base station. The base station switches the connections of the terminals to a base station controller 114 that switches them on to other parts of the system and to the fixed network. The base station controller 114 controls the operation of one or more base stations.

With reference to FIG. 2, let us examine an example of the transmitter 100 and a receiver 102, to which the solution of the preferred embodiments of the invention can be applied. In the example of the figure, the transmitter is thus a base station and the receiver a subscriber terminal, but the preferred embodiments can also be applied when the receiver is a base station receiver. The transmitter 100 and receiver 102 thus communicate over a radio channel 108 in the example of FIG. 2. The transmitter 100 comprises a data source 200 that can be a speech coder or some other data source. A signal 202 to be transmitted is obtained from the output of the data source and taken to a channel encoder 204, which in this example is a convolutional encoder. The coded symbols 206 are taken to a modulator 208, in which the signal is modulated in a known manner. The modulated signal is taken to radio frequency parts 210, in which it is amplified and transmitted to the radio path 108 by means of an antenna 212.

On the radio path 108, the signal receives interference and typically also noise. The receiver 102 comprises an antenna 214, with which it receives the signal that is taken to a demodulator 218 through radio frequency parts 216. The demodulated signal is taken to a detector 220, in which the signal is decoded, equalized and detected according to the preferred embodiments of the invention. From the detector, the signal 222 is taken on to other parts of the receiver.

Next, an example of using a trellis with a Viterbi decoder is described in more detail by means of FIG. 3. The figure shows an 8-state trellis diagram as an example. The trellis diagram is determined on the basis of the used code; in the figure, each point has two incoming and two outgoing routes, i.e. the code in question is a code of a 1/n coding ratio. Each column can be called a stage of the trellis. The Viterbi algorithm is solved in a trellis diagram by progressing in stages from left to right or right to left. Each point can be reached via two different routes, and the better of the incoming routes is selected in each point and stored in memory. The selection is based on the metrics mentioned earlier. Path metrics represent the probability of the set of symbols in the received signal leading to the state described by the node in question. Branch metrics, in turn, represent the probabilities of different transitions. The metrics of the incoming routes are thus calculated at each point in such a manner that the branch metric of the transition between the previous node and the node being processed is added to the path metric of the previous node on the route. Depending on the method, either the higher or the smaller of these is selected for continuation.

In the conventional Viterbi algorithm, all paths and nodes are checked. When using the M algorithm, only M paths are selected for continuation at each stage. If M equals the number of all states, then this is a plain Viterbi algorithm. The M algorithm is known per se to a person skilled in the art and is not described in more detail herein. Reference is made to publication Schlegel: *Trellis coding*, IEEE Press, ISBN: 0-7803-1052-7, pages 153 to 189.

Let us examine an example of an embodiment for calculating a trellis by means of the flow charts of FIGS. 4A and 4B. All calculation is performed using modulo arithmetic. At the initialisation stage, path metrics are initialised 400 as in the Viterbi algorithm, i.e. in such a manner that the state index number 0 is given a large path metric (let us mark it by $PM_{MAX}$) and the other state indexes are given a small path metric. Next, the threshold values $TH_1$, $TH_2$, ..., $TH_N$ are initialised 402 in such a manner that the highest threshold value $TH_1$ equals $PM_{MAX}+C_1$ MOD 2D, wherein D is the biggest possible difference between any two path metrics. Modulo arithmetic is described in more detail later on. The next threshold value $TH_2$ equals $PM_{MAX}+C_2$ MOD 2D and so on. The constants $C_1$ can be negative and $C_1>C_2>C_3 \ldots >C_N$. Next the set of the surviving state indexes is initialised 404 in such a manner that at least the state index 0 is included. The survivors refer to the state indexes that are included in the next stage.

When calculating each stage of the trellis, first the new path metrics are calculated 406, as in the M and Viterbi algorithms, for the new transitions of the state indexes selected for continuation from the previous stage. A suitable group is determined 408 for each new path metric according to its value by comparing the calculated value with the threshold values. This can be done for instance by finding the highest threshold value that is smaller than the calculated path metric. The index of the threshold value determines the suitable group. Thus, the state indexes whose path metrics are larger than $TH_1$ are placed in group 1, the state indexes whose path metric values are between $TH_1$ and $TH_2$ are placed in group 2, and so on. The highest path metric value is found 410 and marked by $PM_{MAX}$. The difference between the new $PM_{MAX}$ and the previous $PM_{MAX}$ is calculated and the value is marked by d.

Next, the threshold values $TH_i$ are updated 412 for instance as follows: $TH_i=(TH_i+d) \mod 2D$, wherein D is the biggest possible difference between any two path metrics.

Next, the M state indexes to continue to the next stage are selected 414. The selection is started from group 1 that comprises the largest path metrics, i.e. the group to which the state indexes higher than the threshold value $TH_1$ were placed. The state indexes in this group are selected for continuation in a random order. Next the state indexes of group 2 are selected in a random order. This is continued one group at a time until M state indexes have been selected.

Let us take a numerical example to clarify the selection for continuation. The numerical values are herein selected randomly to illustrate the example. Let us assume that group 1 has 10 state indexes, group 2 has 25 state indexes, group 3 has 23 state indexes, group 4 has 58 state indexes and group 5 has 13 state indexes. There may also be more groups than mentioned here. Let us further assume that M=128, i.e. 128 state indexes are selected for continuation for the calculation of the next stage. All state indexes from groups 1, 2, 3 and 4 are then selected for continuation in a random order within each group. This way, 116 indexes are selected. Next, 12 state indexes are selected for continuation in a random order from group 5 to achieve the desired total number of 128.

Let us next examine FIG. 5A that illustrates calculation done using modulo arithmetic. The figure shows a modulo circle having the value 0 at the top 500 when moving towards the right, the value D at the bottom 502 and the value 2D at the top 500 when coming from the left. Thus, the greatest distance between two points on the circumference of the circle can be D. With modulo arithmetic, all path metrics calculated for the state indexes can be placed on this circumference. FIG. 5A illustrates an example on how the path metrics are placed on the circumference at time instant n, as well as the use of the threshold values. The figure shows six threshold values $TH_1$, $TH_2$, ..., $TH_6$. Further, a set of calculated path metrics are marked by black dots in the figure, of which the metrics 508 are larger than the highest threshold value $TH_1$, and thus belong to the first group. The path metrics 510 belong to the next group. The state indexes selected for continuation are thus selected starting from the first group 508 in a random order within each group. In a preferred embodiment, the difference d between the largest path metric 504 and the second largest path metric 506 is defined, and for the next stage, the threshold values $TH_1$, $TH_2$, ..., $TH_6$ are moved clockwise on the circumference to the extent of said distance. This is illustrated in FIG. 5B that shows the placement of the threshold values and path metrics on the circumference at time instant n+1. This is repeated until the trellis has been searched.

FIG. 6A shows a possible arrangement of an embodiment. The arrangement comprises means 600 for calculating the path metrics of state indexes. The earlier path metrics 602 and the branch metrics 604 from the previous stages of the trellis to the points of the stage being calculated are used as input. The calculated path metrics 606 of the state indexes are taken to means 608, in which the path metrics are arranged in groups by comparing them with threshold values. Information 610 on the group of each state index is taken to memory means 612, as is information 606 on the calculated path metrics. The largest calculated path metric is stored in memory 614. Control means 616 control the operation of the arrangement and determine the state indexes to continue as described above. The control means also update the threshold values as described above. The means required by the embodiment can preferably be implemented by program in a processor, or as separate components or as an ASIC circuit.

A second embodiment uses fixed threshold values that are stored in a ROM (read-only memory) memory, for instance. This way, when calculating the different stages, the actual threshold values need not be recalculated, but suitable limits are selected for the new groups from the existing threshold values. This embodiment is faster than the one described earlier, because no time is needed for calculating the threshold values. It is easy to store several threshold values in the ROM memory, because the storing density of ROMs is quite high.

This embodiment is illustrated by means of FIG. 5A. Let us assume that when calculating a specific trellis stage, the threshold values are defined in such a manner that the best group is the range from TH2 to TH3, the second best is from TH3 to TH4 and the third best is from TH4 to TH5. When calculating the next stage, the groups can be "shifted" forward on the circle in such a manner that the best group is the range from TH1 to TH2, the second best from TH2 to TH3, and so on. The actual threshold values TH1, TH2, ..., TH5 are stored in the memory.

FIG. 6B shows a possible arrangement of a second embodiment. The arrangement comprises means 600 for calculating the path metrics of state indexes. The earlier path metrics 602 and the branch metrics 604 from the previous stages of the trellis to the points of the stage being calculated are used as input. Information on the calculated metrics is taken to a comparator 620, in which the calculated metric is compared with information 622 obtained from memory 614 on the largest calculated metric thus far. If the new metric is larger than the earlier, the memory 614 is instructed to store 624 the metric 626 in question.

The calculated metric is taken on to a control unit 616. The control unit 616 checks the threshold value limits from a threshold value memory 628. The threshold value memory stores the limits of the used groups. The control unit can for instance send information on the value of the calculated metric to the memory 628 which then returns information 632 on the group to which the calculated metric belongs. After this, the control unit checks 634 from a maintenance memory 636, in which memory element the metric can be stored. Next, the control unit 616 stores 638 the metric in the location in question in a metrics memory 640. The maintenance memory 636 is updated with the location in question.

The maintenance memory 636 is a memory element that keeps a record on what is stored in which memory location of the metrics memory 640. The maintenance memory thus lists the locations of different groups in the metric memory. The metrics memory 640 is processed dynamically in the sense that the metric belonging to a better group can be stored in a memory location storing the metric of a poor group.

When moving on to calculate the next trellis stage, the control unit 616 selects suitable limits from the existing threshold values for the new groups in the threshold value memory 628.

When calculating the stage of the trellis, M first calculated values are written directly into the metrics memory 640, and the information on the memory locations of the metrics memory are updated into the maintenance memory 636. When the next metrics are calculated, values belonging to a poorer group are replaced by values belonging to better groups in the metrics memory. This alternative provides the advantage that the size of the metrics memory can be limited to be M memory locations, and in addition, a small maintenance memory is needed.

In this embodiment, the maximum and minimum values of the metrics are obtained when calculating the metrics of the stage. The range between these values varies depending on channel conditions, and the metrics are selected for continuation in proportion to this range.

One embodiment keeps a record of both the maximum and the minimum value of the metric. It is then possible to monitor the range between these values. If all values are close to each other, the threshold values can be changed on the basis of this information. Thus, it is possible to avoid a situation in which all metrics accumulate in one group.

FIG. 7 illustrates one embodiment for implementing the memory 612. FIG. 7 shows the memory 612, in which each horizontal line is one memory location for storing the information on one state index. The left column 700 shows the address of the memory location. The address field of the memory location is divided into two sections, the first section 702 and the second section 704. The first section 702 of the address indicates the state index group directly. Thus, in the example of FIG. 7, if the address begins with bits "111 . . . " it refers to the first group 706, into which it is possible to store the state indexes of the largest path metric. Correspondingly, if the address begins with bits "000 . . . ", it refers to the last group 708. The second section 704 of the memory location refers to the location of the memory location inside the group. When calculating the path metrics of the state indexes, the state indexes can be directly stored in the same area of memory as the state indexes of the same group. The order of the state indexes inside the group bears no significance. This address arrangement of the memory allows an advantageous selection of M state indexes for continuation. When selecting the state indexes for continuation, the routine reads the memory starting from the used memory locations of the first group from the bottom towards the first element (1110000 in the example of the figure) of the group, and then moves to the next group, skipping the empty memory locations. When a desired number of state indexes have been read, the routine is ended.

Even though the invention has been explained in the above with reference to examples in accordance with the accompanying drawings, it is apparent that the invention is not restricted to them but can be modified in many ways within the scope of the attached claims.

The invention claimed is:

1. A method for decoding a convolutionally coded signal in a receiver, using a search through a trellis, in which at each stage of the trellis a certain set of state indexes of the stage are selected for continuation, the method comprising, at each stage of the trellis:
   defining more than one unequal threshold value for the values of the state indexes, each threshold value defining one state index group,
   calculating for each state index a path metric,
   arranging the calculated state indexes into different state index groups by comparing the path metric value of the state index with the threshold values, and
   selecting state indexes for continuation from the state index groups in such a manner that starting from the state index group comprising the highest state indexes, state indexes are selected from the state index group comprising the highest state indexes in a random order until all the state indexes of the group have been selected, then continuing to select the state indexes from the next state index group, and repeating this until a certain number of state indexes have been selected.

2. The method as claimed in claim 1, wherein at least part of the calculation is done using modulo arithmetic.

3. The method as claimed in claim 1, further comprising arranging the calculated state indexes into different state index groups by finding the highest threshold value that is smaller than the calculated path metric.

4. The method as claimed in claim 1, wherein when calculating each stage, the used threshold values are selected from specific preset threshold values.

5. The method as claimed in claim 1, wherein the threshold values are defined by adding to the corresponding threshold value used in calculating the previous stage the difference between the largest calculated path metrics of the two previous stages.

6. The method as claimed in claim 1, wherein the selection of the threshold values is done on the basis of the state index values.

7. The method as claimed in claim 1, further comprising:
   placing the calculated state indexes in a state index group by comparing the value of the state index path metric with the threshold values,
   checking whether there are state indexes that belong to a poorer group among the stored state indexes and if there are,
   storing the calculated state index path metric on top of the state index value belonging to a poorer group, and storing the address of the memory location.

8. The method as claimed in claim 1, further comprising defining the maximum and minimum values of the metric.

9. The method as claimed in claim 8, further comprising using the maximum value of the metric in defining the threshold values.

10. An arrangement for enhancing a search through a trellis in a decoder that is arranged at each stage of the trellis to select a certain set of state indexes of the stage for continuation, wherein the decoder is arranged, when each stage of the trellis is calculated,
- to define more than one unequal threshold value for the values of the state indexes, each threshold value defining one state index group,
- to calculate for each state index a path metric,
- to arrange the calculated state indexes into different groups by comparing the path metric value of the state index with the threshold values, and
- to select from the groups a certain number of state indexes for continuation in such a manner that starting from the group comprising the highest state indexes, entire groups are selected for continuation until the next entire group does not fit in, and from this group only randomly selected state indexes are selected until a given number is collected.

11. The arrangement as claimed in claim 10, wherein the decoder is arranged to perform at least part of the calculation by using modulo arithmetic.

12. The arrangement as claimed in claim 10, wherein the decoder comprises:
- means for calculating the path metrics for different state indexes,
- memory configured to store the path metrics of the state indexes, and
- memory configured to store the threshold values.

13. The arrangement as claimed in claim 10, wherein the decoder comprises:
- memory configured to store the highest path metric value, and
- a threshold value control unit, configured to add to the corresponding threshold value used in calculating the previous stage the difference between the largest calculated path metrics of the two previous stages.

14. The arrangement as claimed in claim 10, wherein the decoder comprises memory, into which a set of threshold values are stored in advance, and means arranged to select the threshold values used, when each stage is calculated, from the preset threshold values.

15. The arrangement as claimed in claim 10, wherein the decoder is arranged to select the threshold values on the basis of the values of the state indexes.

16. The arrangement as claimed in claim 10, wherein the decoder comprises:
- means for calculating path metrics for different state indexes,
- memory configured to store the path metrics of the state indexes,
- memory configured to store the addresses of the memory locations of the state indexes, and
- memory configured to store the threshold values.

* * * * *